United States Patent [19]

Higashikawa et al.

[11] Patent Number: 4,510,173
[45] Date of Patent: Apr. 9, 1985

[54] METHOD FOR FORMING FLATTENED FILM

[75] Inventors: Iwao Higashikawa; Tsunetoshi Arikado, both of Tokyo, Japan

[73] Assignee: Kabushiki Kaisha Toshiba, Kawasaki, Japan

[21] Appl. No.: 601,934

[22] Filed: Apr. 19, 1984

[30] Foreign Application Priority Data

Apr. 25, 1983 [JP] Japan .................................. 58-71367
Jun. 6, 1983 [JP] Japan .................................. 58-100388

[51] Int. Cl.³ .................................................. B05D 3/06
[52] U.S. Cl. .................................... 427/44; 427/54.1; 427/96; 427/375
[58] Field of Search ................... 427/44, 54.1, 96, 375

[56] References Cited

U.S. PATENT DOCUMENTS 3,971,316  7/1976  Schank et al. ..................... 427/375
3,976,524  8/1976  Feng ................................... 427/96
4,171,979  10/1979  Novak et al. ...................... 427/54.1
4,427,713  1/1984  White et al. ....................... 427/54.1

OTHER PUBLICATIONS

Bessemir, *Radiation Curing*, May 1976, pp. 10-16.

Primary Examiner—John H. Newsome
Attorney, Agent, or Firm—Oblon, Fisher, Spivak, McClelland & Maier

[57] ABSTRACT

A flat film can be formed on a functional structure having uneven surface formed on a semiconductor substrate firstly by applying a film-forming organic material capable of being cured by energy beams and exhibiting fluidity by heat on the uneven surface of the functional structure. Then, the organic material is fluidized by applying heat to the applied organic material, thereby substantially flattening the surface of the organic material. Energy beams are irradiated to the flattened organic material to cure the flattened organic material, thereby converting the flattened organic material into a cured film which is not deformed by heat and energy beams.

14 Claims, 12 Drawing Figures

METHOD FOR FORMING FLATTENED FILM

BACKGROUND OF THE INVENTION

I. Field of the Invention

The present invention relates to a method for forming a surface configuration having a flat surface on a semiconductor substrate and, more particularly, to a method for forming a flat film on a surface configuration having a stepped or irregular surface, thereby allowing an accurate micro-patterning of the surface configuration.

II. Description of the Prior Art

Many micro-patterning processes have recently been developed to perform higher function and higher integration in a field of fabricating an ultrafine semiconductor device such as a semiconductor integrated circuit. In the manufacture of a semiconductor device, insulating layers and electrode wiring layers are formed on a semiconductor substrate. Thus, stepped or irregular surface is frequently formed on the surface configuration of the substrate, making the micro-patterning of the surface configuration of the substrate difficult. In other words, it is, for example, difficult to uniformly form a resist film on such uneven surface configuration, and the influence of the uneven surface results in remarkable decrease in the resolution of the resist pattern. In order to solve this problem, a multilayer resist system has been developed. For instance, such a multilayer resist system was described in Solid State Technology/August 1981 and J.Vac. Sci. tech 16(6) Nov./Dec., 1979. In this multilayer resist system, at least one layer of film is formed between a resist film and a substrate. In many cases, this film is a sufficiently thick resist film which planarizes the uneven surface. The thick resist film provides a flat supporting surface for the resist film of the uppermost layer, and prevents the resolution from decreasing due to random reflection of a light from the uneven surface in a photolithography, and supplements insufficient dry etching resistance of the resist in an electron beam, X-ray or deep UV lithography.

Specifically, the above-described planarizing film includes, depending on an etching method to be used, a positive resist baked at 200° C. for 1 hour, a polymethylmethacrylate baked at 170° C. for 30 min., and a deep UV resist film softly baked suitably to be executed with simultaneous transfer exposure by the deep UV. However, as a result of the present inventors' studies on multilayer resist system of this type, the following problems have arisen.

The surface of a baked positive photoresist which has heretofore been used can considerately planarize the uneven surface, but yet reflects the uneven surface as compared with the surface appearing after coating and before baking, and the surface is not safficiently flattened. The resist film often decreases in thickness at baking, and the surface unevenness of the film increases as compared with the surface immediately after coating. This is because, firstly, the positive photoresist shrinks in volume at curing by baking, and, secondly, the positive photoresist completely cures before being flattened, though the photoresist is fluidized by heat. Further, the positive resist is partially decomposed by baking, which may be another cause of decreasing the thickness of the film.

Thus, the uppermost resist film is not uniform in thickness even if it is formed through the above-described planarizing film, and its resolution is consequently decreased, thereby lowering the transfer accuracy of a predetermined pattern. In order to establish substantially completely flattened surface, it is known to increase the thickness of the planarizing film, but this results in a remarkable decrease in the transfer accuracy of the pattern.

SUMMARY OF THE INVENTION

It is an object of the present invention to provide a method for forming a flat film on an uneven surface structure provided on a semiconductor substrate, thereby allowing accurate micro-patterning of the surface structure.

It is another object of the present invention to provide a method for micro-patterning an uneven surface structure in which a resist pattern can be formed on a flat surface, thereby improving the processing accuracy.

According to the present invention, there is provided a method for forming a flat film on a functional structure having uneven surface formed on a semiconductor substrate comprising the steps of:

applying a film-forming organic material capable of being cured by energy beams irradiation and exhibiting fluidity by heat on a surface of said functional structure;

fluidizing the organic material by applying heat to the applied organic material, thereby substantially flattening the surface of the organic material; and irradiating energy beams to the flattened organic material to cure the flattened organic material, thereby converting the flattened organic material into a cured film which is not deformed by application of heat and energy beams thereto.

The "functional structure" used in this specification and claims means the structure normally formed on a semiconductor substrate (which includes predetermined semiconductor regions) in the manufacture of a semiconductor device, and includes an insulating layer, an electrode wiring layer and/or a resist layer. These structures have functional properties such as an insulating function and a wiring function, and are accordingly called "the functional structure".

DETAILED DESCRIPTION OF THE PREFERRED EMBODIMENTS

Figure 1:
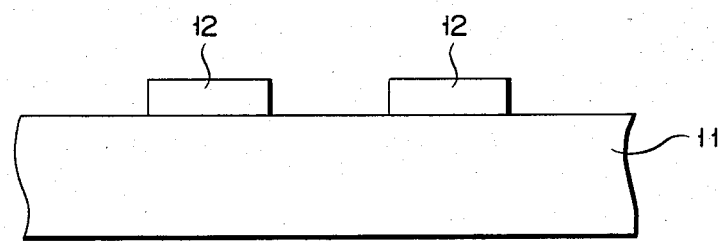
FIGS. 1 to 3 are schematic views for explaining the principle concept of the present invention.

The present invention will now be described in more detail with reference to the accompanying drawings. The same reference numerals denote the same parts throughout the figures.

The fundamental principle of the present invention will now be described with reference to FIGS. 1 to 3. In FIG. 1, there is shown a semiconductor substrate such as a silicon substrate 11 which has, as a functional structure having an uneven surface, an insulating pattern 12 on the surface. The insulating pattern 12 can be obtained by forming a layer of an insulating material such as silicon dioxide on the substrate 11 and etching the silicon dioxide layer to selectively expose the surface of the substrate 11 by photoetching process. The thickness of this silicon dioxide pattern 12 is, for example, about 1 μm.

Figure 2:
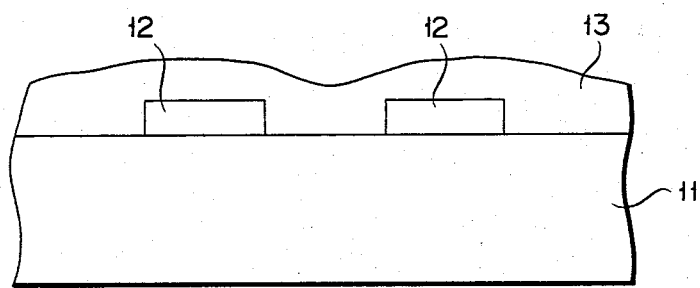
Figure 3:
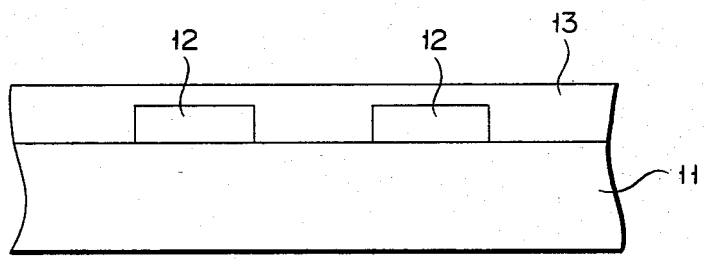

Then, as shown in FIG. 2, an organic material 13 of the present invention is coated, for example, by a spin-coating method on the entire surface of the structure of FIG. 1. The organic material used in the present invention is a film-forming material which exhibits fluidity by heat and can be cured by energy beams. The organic material is preferably not shrinked in volume nor decomposed at curing. The organic material is not cured by the applied heat while it is exhibiting the fluidity. The non-limiting representative examples of the organic materials include siloxane-based polymer including polyorganosiloxane such as, for example, polyvinylmethyl siloxane, polyvinylphenyl siloxane, polysiloxane; styrene-based polymer such as, for example, chlorinated polystyrene, polychloromethylstyrene. These organic materials are dissolved in a solvent and coated. The solvent preferably includes, alcohol such as, for example, isopropyl alcohol for the siloxane-based polymer, and ethylcellosolve acetate for the styrene-based polymer. The concentration of the polymer in the solution is not particularly limited, but is preferably 5 to 30% by weight.

Particularly, when the siloxane-based polymer is used, it has been found that the cure of the polymer by irradiation of energy beams can be remarkably accelerated if an energy beam-sensitive curing agent such as, for example, peroxy ester (e.g., tertbutylperoxybenzoate) is mixed in the organic material in an amount of, for example, 0.1 to 2.0% by weight.

The thickness of the organic material is larger than the size of the stepped portion (i.e., approx. 1 μm in the above-described example) and is, for example, about 3 μm.

Then, the organic material layer 13 coated as described above is heat-treated. This heat treatment is carried out under the conditions (temperature and time) sufficient to fluidize the organic material, and the organic material is fluidized, flattening its surface. For example, in the above-described example, when polychloromethylstyrene is used as the organic material, the heat treatment may be conducted at about 200° C. for 1 hour. Thus, the organic material layer 13 is remarkably flattened as shown in FIG. 3.

Finally, energy beams are irradiated to the organic material layer 13 thus flattened as described above to cure the organic material. The energy beams used for the curing include ultraviolet rays, far ultraviolet rays, X-rays, and electron beams. Any of the above-exemplified organic material is crossliked to cure by the energy beams. The organic material layer thus cured is not deformed even if heat and/or energy beams are applied to it, and maintains its flat surface stably. The conditions under which the energy beams are applied can be suitably determined by a simple preliminary experiments. This curing treatment may be performed after the fluidized organic material is cooled, but preferably conducted while the organic material is still hot since the curing reaction is accelerated under such conditions.

As described above, according to the present invention, the flat film can be formed on the surface of the functional structure having uneven surface, and therefore other films such as, for example, a resist film can be formed flatly in the uniform thickness on the flat film. Thus, the present invention greatly contributes to the micro-patterning of the functional structure.

An embodiment in which the present invention is applied to the formation of a patterned wiring layer in a semiconductor device will be described below with reference to FIGS. 4 to 8.

Figure 4:
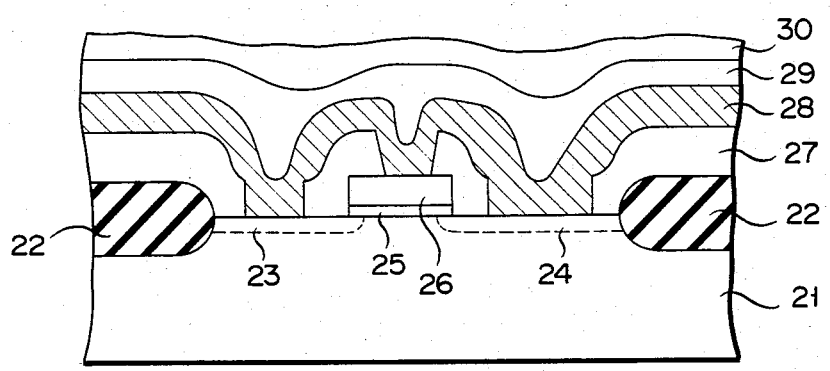
FIGS. 4 to 8 are views for explaining an embodiment according to the present invention.

A MOS transistor structure is shown in FIG. 4. More specifically, a field oxide film 22 which defines an element region is formed on a silicon substrate 21, and a source region 23 and a drain regin 24 are formed in the element region of the substrate 21. A gate oxide film 25 is formed on the surface portion of the substrate 21 corresponding to an area between the source region 23 and the drain region 24, and a polycrystalline silicon gate electrode 26 is formed thereon. A silicon dioxide film 27 is formed to cover the substrate 21 and the gate electrode 26, etc. This silicon dioxide film 27 has openings through which the source region 23 and the drain region 24 as well as the gate electrode 26 are exposed partly. A layer 28 of a wiring metallic material such as, for example, aluminum-silicon alloy is formed on the silicon dioxide film 27. The metallic material layer 28 contacts, through the openings of the silicon dioxide layer 27, the source region 23 and the drain region 24 as well as the gate electrode 26. The thickness of the metallic material layer 28 is, for example, about 1 μm. A positive photoresist 29 is spin-coated in the thickness of about 1.2 μm to cover the layer 28, and baked at 100° C. for 3 minutes. The surface of the positive photoresist layer 29 is not flat due to the uneven surface of the metallic material layer 28. As is known, the positive photoresist is colored brown or black by baking, thereby preventing the random reflection of light from the underlying layer or layers.

Figure 5:
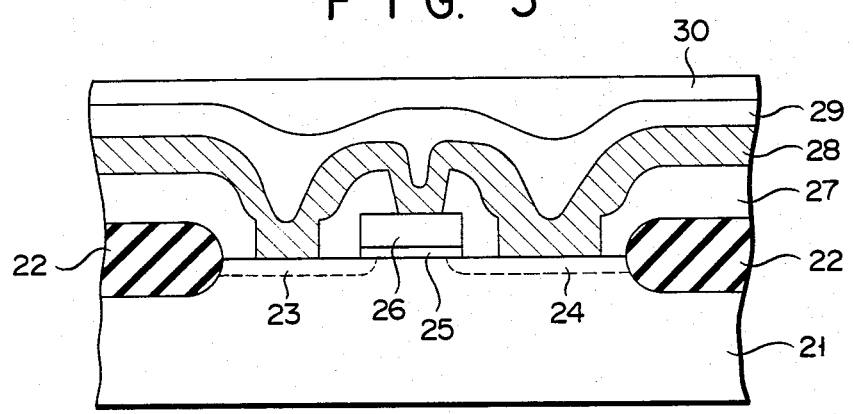
Figure 6:
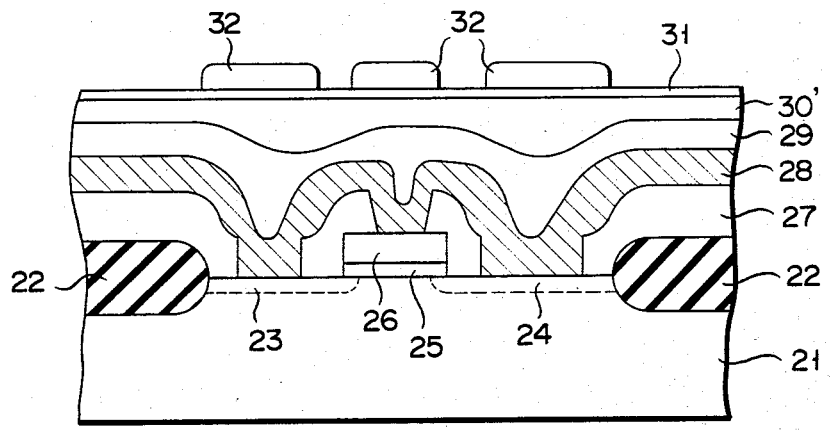

An organic material 20 of the present invention as described above, such as polychloromethlylstyrene is coated in the form of a solution in ethylcellosolve acetate in a concentration of about 10% by weight to a thickness of about 0.5 μm on the positive photoresist layer 29. Subsequently, the organic material 30 is baked at 200° C. for 1 hour in the atmosphere. The organic material 30 is fluidized by the baking so that the surface becomes flat. As a result, substantially completely flat organic material layer 30 can be obtained (FIG. 5).

Then, far ultraviolet rays are irradiated (e.g., for 10 min.) to the entire surface of the flattened organic material layer 30 to cure the layer 30. Thus, the organic material layer 30 is converted into a cured film 30' (FIG. 6) which is not deformed even if heat and/or energy beams are applied thereto. During this curing treatment, the flatness of the cured film is not lowered. Thereafter, a silicon dioxide film 31 is formed by a sputtering method to a thickness of about 0.15 μm, the positive photoresist is formed to a thickness of about 0.6 μm thereon, and the photoresist is patterned by an ordinary method to form a resist pattern 32.

Figure 7:
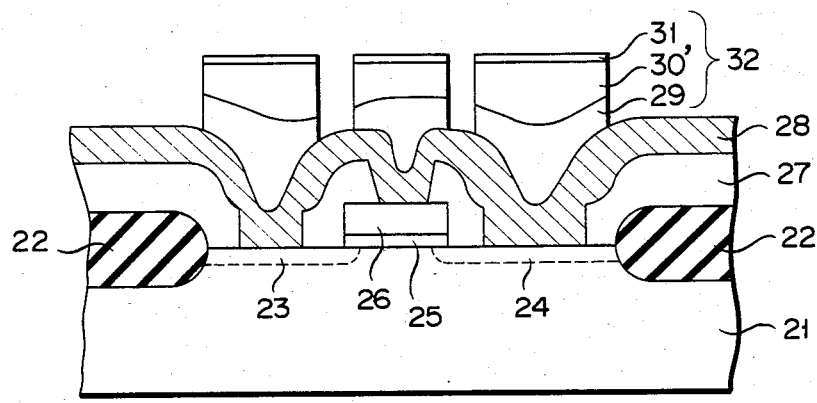

Subsequently, with the resist pattern 32 used as a mask, the silicon dioxide film 31 is anisotropically dry etched by a reactive ion etching method by using a mixed gas of carbon tetrafluoride and hydrogen. Then, with the etched silicon dioxide film pattern which are covered with the resist pattern 32 used as a mask, the film 30' and the positive photoresist film 29 are sequentially etched by an anisotropic dry etching method using oxygen gas. Thus, as shown in FIG. 7, a mask pattern 33 suitable for patterning the metallic material layer 28 is obtained.

Figure 8:
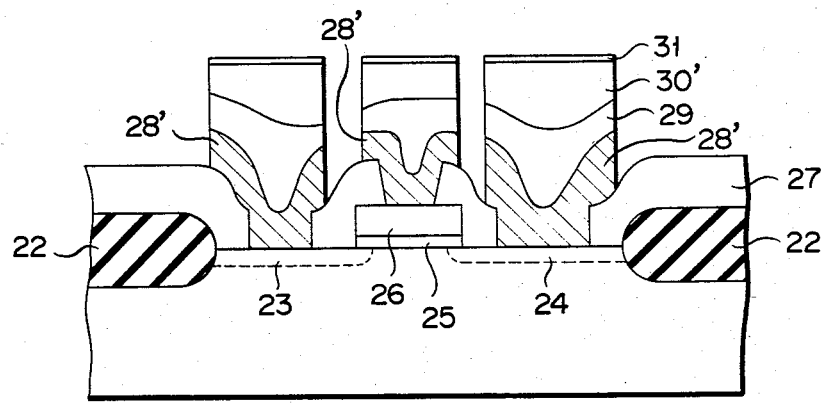

Finally, the metallic material layer 28 is etched by using the mask pattern 33 obtained above to form a desired wiring layer pattern 28' (FIG. 8).

In the embodiment of the present invention described with reference to FIGS. 4 to 8, the mask 33 for patterning the metallic material layer 28 includes the patterned silicon dioxide film, but the mask for patterning the metallic material layer is formed so as not to include the silicon dioxide film. The embodiment of this case will be described with reference to FIGS. 9 to 12.

Figure 9:
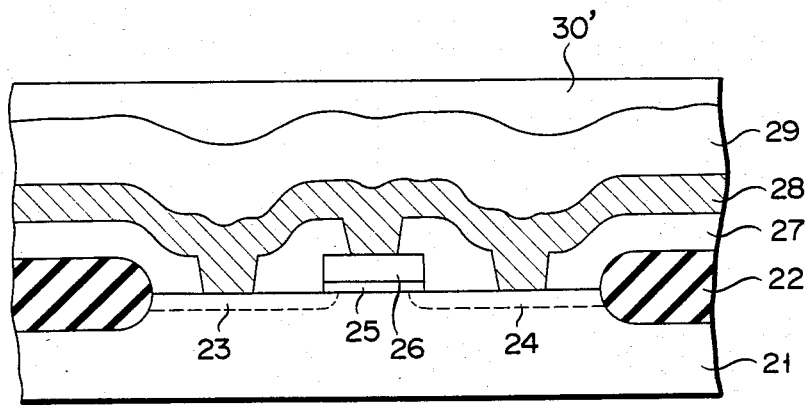
FIGS. 9 to 12 are views for explaining a second embodiment according to the present invention.

As described with reference to FIGS. 4 to 5, the organic material layer of the present invention is formed similarly on the MOS transistor structure, is fluidized and flattened. At this time, a siloxane-based polymer such as polyvinylmethyl siloxane having a molecular weight of 150,000 (having a softening point lower than the ambient temperature) is used as the organic material and dissolved in isopropanol in a concentration of 15% by weight. The solution is spin-coated to a thickness of about 0.75 $\mu$m, and heat treated at 120° C. for 1 hour so as to evaporate the solvent and fluidize the organic material. Far ultraviolet rays are irradiated to crosslink and cure the flattened organic material layer. The organic material layer is thus converted into a film 30' which is not deformed even by the application of heat and energy beams thereto. This state is shown in FIG. 9.

Figure 10:
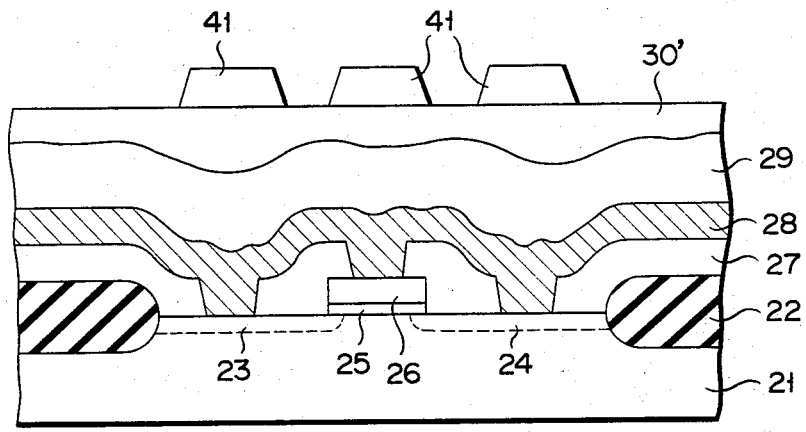

Subsequently, as shown in FIG. 10, a positive photoresist is entirely coated on the cured film 30' and a resist pattern 41 is formed by patterning the photoresist film using the ordinary lithographic process. At this time, the thickness of the resist film becomes uniform due to the flatness of the underlying film 30', and the thickness of the resist film pattern 41 also becomes uniform. In addition, the thickness of the resist film may be thinner than that of the conventional film, and since random reflection of the light from the underlying layer or layers is prevented by the positive photoresist layer 29 thus baked, extremely high resolution can be achieved.

Figure 11:
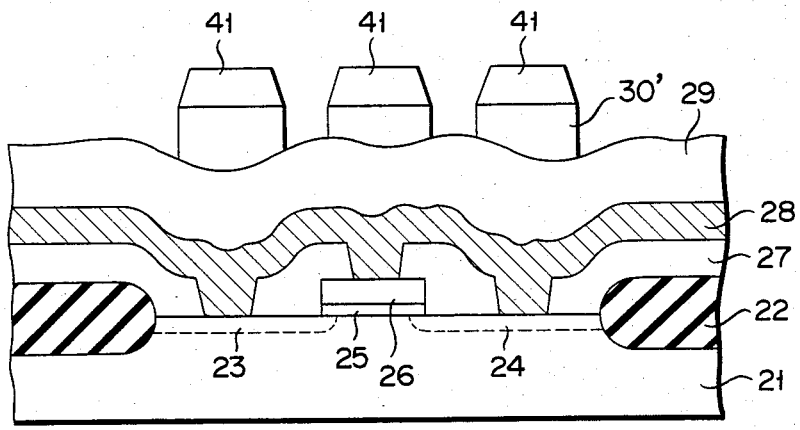

Thereafter, as shown in FIG. 11, with the resist pattern 41 used as a mask, the cured polyvinylmethyl siloxane film 30' is selectively anisotropically etched by a reactve ion etching method using a mixed gas of carbon tetrafluoride and hydrogen. This etching can be performed in 20 min. under the conditions of 30 milli-Torr of gas pressure and 150 W of high frequency power by using a parallel flat plate type dry etching apparatus.

Figure 12:
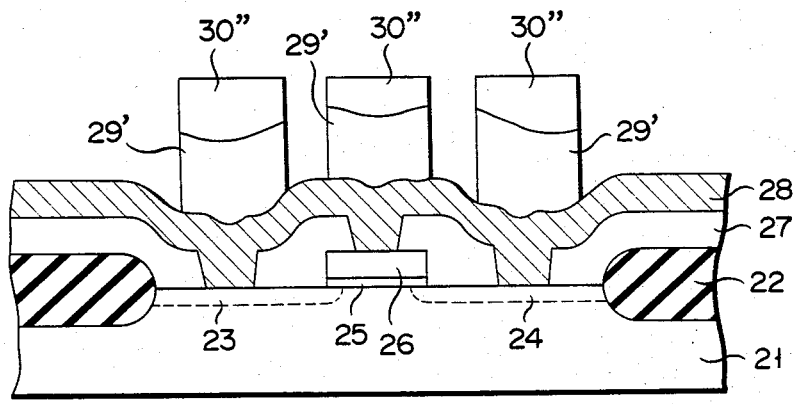

Then, as shown in FIG. 12, the resist pattern 41 is removed and, with the remaining polyvinylmethyl siloxane film 30" used as a mask, the resist film 29 is selectively anisotropically etched. This etching can be achieved in 20 min. under the conditions of 0.003 Torr of oxygen gas pressure and 150 W of high frequency power by employing a parallel flat plate type dry etching apparatus. During the etching, the polyvinylmethyl siloxane is not deteriorated since it contains silicon as a constitutional element. Incidentally, the etching of the resist film 29 can be performed without removing the polymeric film pattern 30".

Finally, the remaining polyvinylmethyl siloxane film 30" is removed by plasma etching using a mixed gas of carbon tetrafluoride and oxygen at molar ratio of 1:1 and, with the remaining resist pattern 29' used as a mask, the metallic material layer 28 is selectively etched by reactive etching using carbon tetrafluoride gas, thereby obtaining a wiring pattern similar to that shown in FIG. 8.

According to this second embodiment, siloxane-based polymer which includes as constituent element is used as the organic material of the present invention, and it thus has a sufficient resistance, as the mask, to anisotropically dry etching of the underlying organic film such as a resist film by employing oxygen gas. It is, therefore, not necessary to form a spacer film such as a silicon dioxide film between the resist formed as the uppermost layer and the organic material layer of the present invention.

The present invention has been described on the basis of the concrete embodiments, but should not be limited thereto. For example, the layer underlying the organic material layer of the present invention is not limited to the resist, but may be other film-forming organic materials. Further, the heat treating conditions to fluidize the organic material of the present invention (temperature and time) may be suitably determined according to the organic material to be used. However, when the resist is used as the underlying layer, the heat treatment for fluidizing the organic material of the present invention is preferably conducted at a temperature lower than 200° C., since the decomposition temperature of the resist is normally 280° to 300° C. Further, in the embodiments described above, the metallic material is used as a material to be patterned. However, the material may be polycrystalline silicon.

What is claimed is:

1. A method for forming a flat film on a functional structure having uneven surface formed on a semiconductor substrate comprising the steps of:
    applying a film-forming organic material capable of being cured by energy beams and exhibiting fluidity by heat on said uneven surface of the functional structure;
    fluidizing the organic material by applying heat to the applied organic material, thereby substantially flattening the surface of the organic material; and
    irradiating energy beams to the flattened organic material to cure the flattened organic material, thereby converting the flattened organic material into a cured film which is not deformed by heat and energy beams.

2. The method according to claim 1, wherein said organic material is applied to the surface of said functional structure in the form of a solution in a solvent.

3. The method according to claim 2, wherein said organic material comprises a siloxane-based polymer, and said solvent is an alcohol.

4. The method according to claim 3, wherein said siloxane-based polymer is a polyorganosiloxane.

5. The method according to claim 4, wherein said organic material is polyvinylmethyl siloxane or polyvinylphenyl siloxane.

6. The method according to claim 2, wherein said organic material comprises a styrene-based polymer, and said solvent is ethylcellosolve acetate.

7. The method according to claim 6, wherein said styrene-based polymer is polychloromethyl styrene or chlorinated polystyrene.

8. A method for patterning a functional structure having uneven surface formed on a semiconductor substrate comprising the steps of:
    forming a first film on said uneven surface of the functional structure;
    applying a film-forming organic material capable of being cured by energy beams and exhibiting fluidity by heat on the first film surface;
    fluidizing the organic material by applying heat to the applied organic material, thereby substantially flattening the surface of the organic material;
    irradiating energy beams to the flattened organic material to cure the flattened organic material, thereby converting the flattened organic material into a second film which is not deformed by heat and energy beams;

forming a first pattern comprising a resist on the surface of said second film;

selectively etching said second film using said first pattern as a mask, thereby forming a second pattern;

selectively etching said first film using said second pattern as a mask, thereby forming a third pattern; and patterning said functional structure using said third pattern as a mask.

9. The method according to claim 8, wherein said organic material is applied to the surface of said first film in the form of a solution in a solvent.

10. The method according to claim 9, wherein said organic material comprises a siloxane-based polymer, and said solvent is an alcohol.

11. The method according to claim 10, wherein said siloxane-based polymer is a polyorganosiloxane.

12. The method according to claim 11, wherein said siloxane-based polymer is polyvinylmethyl siloxane or polyvinylphenyl siloxane.

13. The method according to claim 10, wherein said organic material comprises a styrene-based polymer.

14. The method according to claim 13, wherein said styrene-based polymer is polychloromethyl styrene or chlorinated polystyrene.

* * * * *